United States Patent
Brunner et al.

(10) Patent No.: US 9,175,399 B2
(45) Date of Patent: Nov. 3, 2015

(54) PLATING BATH FOR ELECTROLESS DEPOSITION OF NICKEL LAYERS

(71) Applicant: Atotech Deutschland GmbH, Berlin (DE)

(72) Inventors: Heiko Brunner, Berlin (DE); Jan Picalek, Berlin (DE); Iulia Bejan, Berlin (DE); Carsten Krause, Berlin (DE); Holger Bera, Berlin (DE); Sven Rückbrod, Schönefeld (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 14/398,195

(22) PCT Filed: May 31, 2013

(86) PCT No.: PCT/EP2013/061280
§ 371 (c)(1),
(2) Date: Oct. 31, 2014

(87) PCT Pub. No.: WO2013/182489
PCT Pub. Date: Dec. 12, 2013

(65) Prior Publication Data
US 2015/0110965 A1    Apr. 23, 2015

(30) Foreign Application Priority Data
Jun. 4, 2012 (EP) .................................... 12170693

(51) Int. Cl.
C23C 18/50 (2006.01)
C23C 18/34 (2006.01)
C23C 18/36 (2006.01)
(Continued)

(52) U.S. Cl.
CPC ............. *C23C 18/34* (2013.01); *C23C 18/1633* (2013.01); *C23C 18/50* (2013.01); *H01L 21/288* (2013.01); *H01L 21/76849* (2013.01)

(58) Field of Classification Search
CPC ........ C23C 18/50; C23C 18/34; C23C 18/36; C23C 18/1633; B05D 1/18
USPC ........... 106/1.22, 1.23, 1.24, 1.27; 427/430.1, 427/443.1
See application file for complete search history.

(56) References Cited

U.S. PATENT DOCUMENTS 2,841,602 A * 7/1958 Brown et al. .................. 556/119
3,457,089 A * 7/1969 Gulla et al. .................. 106/1.26
(Continued)

FOREIGN PATENT DOCUMENTS

EP   1489201   12/2004
GB   1315212   5/1973
(Continued)

OTHER PUBLICATIONS

Derwent Abstract of EP 1489201; Dec. 2004.*
(Continued)

*Primary Examiner* — Helene Klemanski
(74) *Attorney, Agent, or Firm* — Renner, Otto, Bioselle & Sklar, LLP

(57) ABSTRACT

The present invention relates to aqueous plating bath compositions for deposition of nickel and nickel alloys utilizing novel stabilizing agents possessing a carbon-carbon triple bond and a functional group to enhance the bath performance.

19 Claims, 2 Drawing Sheets

(51) Int. Cl.
  *B05D 1/18* (2006.01)
  *H01L 21/288* (2006.01)
  *H01L 21/768* (2006.01)
  *C23C 18/16* (2006.01)

(56) References Cited

U.S. PATENT DOCUMENTS

| | | | | |
|---|---|---|---|---|
| 3,649,308 | A | * | 3/1972 | Gulla et al. ............ 106/1.22 |
| 3,717,482 | A | * | 2/1973 | Gulla et al. ............ 106/1.27 |
| 4,016,051 | A | | 4/1977 | Geldzahler et al. |
| 4,435,254 | A | | 3/1984 | Lemke |
| 4,600,609 | A | | 7/1986 | Leever et al. |
| 4,699,811 | A | * | 10/1987 | Kunces ................ 427/437 |
| 8,961,670 | B2 | * | 2/2015 | Bera et al. ............ 106/1.22 |
| 2006/0283715 | A1 | | 12/2006 | Diaddario, Jr. et al. |

FOREIGN PATENT DOCUMENTS

| | | |
|---|---|---|
| WO | 2005078163 | 8/2005 |
| WO | 2010053540 | 5/2010 |

OTHER PUBLICATIONS

PCT/EP2013/061280; PCT International Search Report and Written Opinion of the International Searching Authority dated May 27, 2014.
PCT/EP2013/061280; PCT International Preliminary Report on Patentability mailed Feb. 23, 2015.

* cited by examiner

PLATING BATH FOR ELECTROLESS DEPOSITION OF NICKEL LAYERS

The present application is a U.S. National Stage Application based on and claiming benefit and priority under 35 U.S.C. §371 of International Application No. PCT/EP2013/061280, filed 31 May 2013, which in turn claims benefit of and priority to European Application No. 12170693.1 filed 4 Jun. 2012, the entirety of each of which is hereby incorporated herein by reference.

FIELD OF THE INVENTION

The present invention relates to aqueous plating bath compositions for electroless deposition of nickel and nickel alloys. The nickel coatings obtained by the invention show a high uniformity and a high hardness, good wear resistance and corrosion resistance. Such coatings are suitable as a functional coating in aerospace, automobile, electrical and chemical industries. The metal layers deposited from such plating baths are also useful as barrier and cap layers in semiconducting devices, printed circuit boards, IC substrates and the like.

BACKGROUND OF THE INVENTION

Barrier layers are used in electronic devices such as semiconducting devices, printed circuit boards, IC substrates and the like to separate layers of different composition and thereby prevent undesired diffusion between such layers of different composition.

Typical barrier layer materials are binary nickel alloys such as Ni—P alloys which are usually deposited by electroless plating onto a first layer of a first composition followed by deposition of a second layer of a second composition onto the barrier layer. Such first layer can consist of copper or aluminium.

Another application of barrier layer materials in electronic devices is as a cap layer which is e.g. deposited onto copper to prevent corrosion of copper.

Another application of nickel and nickel alloy deposits is corrosion protection for various substrates.

Compositions for electroless nickel plating solutions are known in the art. For example, U.S. Pat. No. 2,658,841 teaches the use of soluble organic acid salts as buffers for electroless nickel plating solutions. U.S. Pat. No. 2,658,842 teaches the use of short chain, dicarboxylic acids as exaltants to EN baths. U.S. Pat. No. 2,762,723 teaches the use of sulfide and sulfur bearing additives to an electroless nickel plating bath for improved bath stability.

U.S. Pat. No. 2,847,327 has introduced other means of stabilizing an electroless nickel plating solution. These include the use of higher purity starting materials; more effective stabilizers from the class of heavy metals such as Pb, Sb, Bi, Cu and Se; inorganic compounds such as iodates, and thio compounds; organic compounds such as unsaturated alkenes and alkynes and others.

OBJECTIVE OF THE INVENTION

It is the objective of the present invention to provide an electroless plating bath for deposition of nickel and nickel alloys which has a high stability against undesired decomposition and provides uniform coatings.

SUMMARY OF THE INVENTION

This objective is solved by providing an aqueous plating bath composition for electroless deposition of nickel and nickel alloys, the plating bath comprising
(i) a source of nickel ions,
(ii) at least one complexing agent,
(iii) at least one reducing agent,
(iv) a stabilising agent according to formula (1):

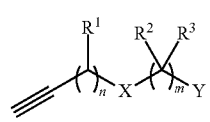

(1)

wherein X is selected from O and $NR^4$, n ranges from 1 to 6, m ranges from 1 to 8; $R^1$, $R^2$, $R^3$ and $R^4$ are independently selected from hydrogen and $C_1$ to $C_4$ alkyl; Y is selected from $-SO_3R^5$, $-CO_2R^5$ and $-PO_3R^5{}_2$, and $R^5$ is selected from hydrogen, C1-C4 alkyl and a suitable counter ion.

The invention further relates to a method for deposition of nickel and nickel alloys by immersing the substrate to be plated into above described plating solution.

DETAILED DESCRIPTION OF THE INVENTION

Figure 1:
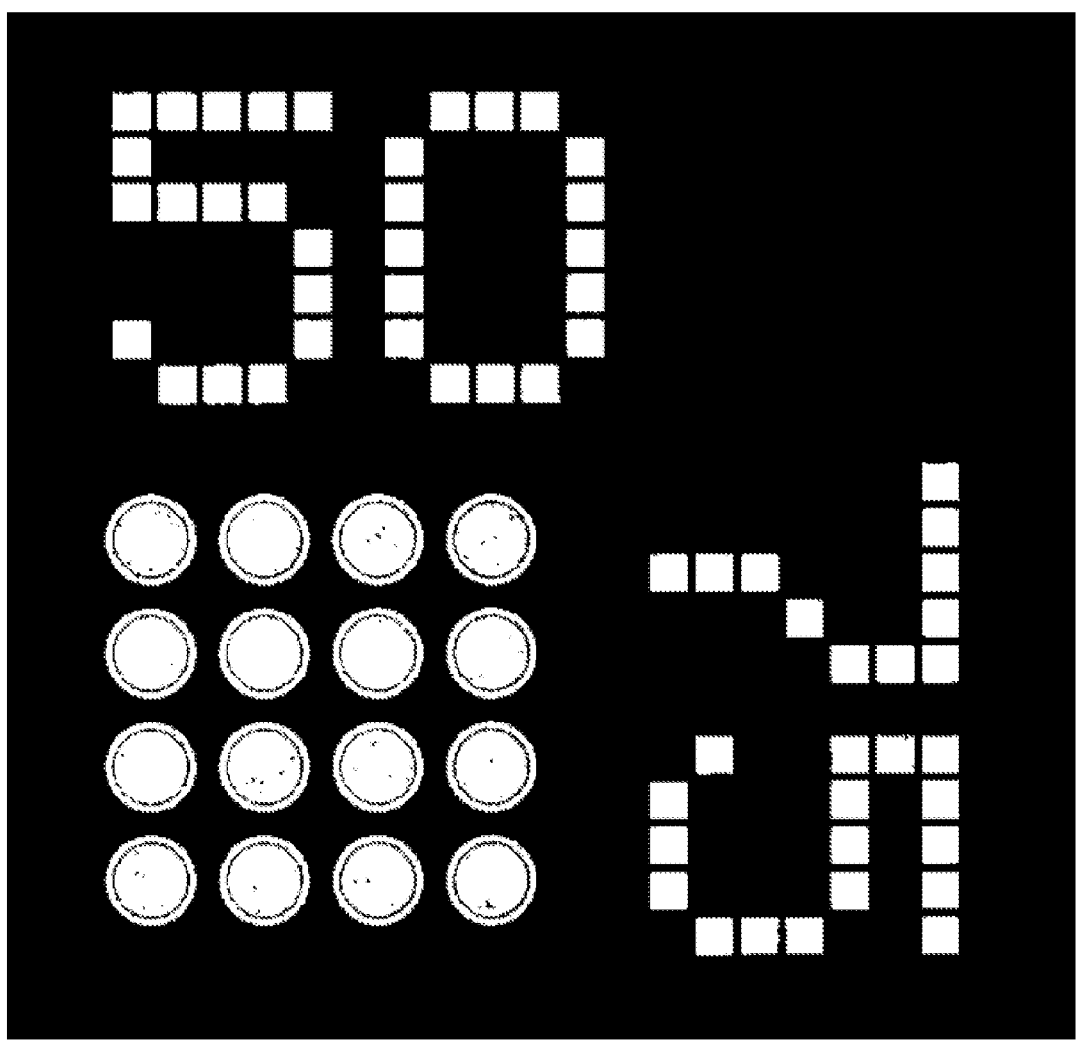
FIG. 1 shows a test substrate having copper pads for electroless nickel deposition.

Electroless nickel plating compositions for applying nickel coatings are well known in the art and plating processes and compositions are described in numerous publications such as U.S. Pat. Nos. 2,935,425; 3,338,726; 3,597,266; 3,717,482; 3,915,716; 4,467,067; 4,466,233 and 4,780,342. Electroless plating generally describes methods not using external current sources for reduction of metal ions. The latter are commonly described as electrolytic or galvanic plating methods. In the electroless plating solutions chemical reducing agents like hypophosphite, boranes or formaldehyde are used to reduce the metal ions to their metallic form and thereby forming a deposit on the substrate.

One commonly used nickel alloy deposit is nickel phosphorous (NiP) alloy. In general, NiP deposition solutions comprise at least four ingredients dissolved in a solvent, typically water. They are (1) a source of the nickel ions, (2) a reducing agent, (3) an acid or hydroxide pH adjuster to provide the required pH and (4) a complexing agent for metal ions sufficient to prevent their precipitation in solution. A large number of suitable complexing agents for NiP solutions are described in the above noted publications. If hypophosphite is used as the reducing agent, the deposit will contain nickel and phosphorus. Similarly, if an amine borane is employed, the deposit will contain nickel and boron as shown in U.S. Pat. No. 3,953,654.

The nickel ion may be provided by the use of any soluble salt such as nickel sulfate, nickel chloride, nickel acetate, nickel methyl sulfonate and mixtures thereof. The concentration of the nickel in solution may vary widely and is about 0.1 to 60 g/l, preferably about 2 to 50 g/l e.g., 4 to 10 g/l.

The reducing agent is usually and preferably the hypophosphite ion supplied to the bath by any suitable source such as sodium, potassium, ammonium and nickel hypophosphite. Other reducing agents such as amine boranes, borohydrides, hydrazine and derivatives thereof and formaldehyde may also suitably be employed. The concentration of the reducing agent is generally in molar excess of the amount sufficient to reduce the nickel in the bath. The concentration of the reducing agent generally ranges from 0.01 to 3.0 mol/l or from 0.05 to 0.35 mol/l.

The baths may be acidic, neutral or alkaline and the acidic or alkaline pH adjustor may be selected from a wide range of materials such as ammonium hydroxide, sodium hydroxide, hydrochloric acid and the like. The pH of the bath may range from about 2 to 12, with acidic baths being preferred. A slightly acidic pH range of preferably from 3.5 to 7, more preferably from 4 to 6.5, is recommended.

A complexing agent (sometimes also referred to as chelating agent) or mixture of complexing agents is included in the plating bath composition for nickel and nickel alloy plating.

In one embodiment, carboxylic acids, hydroxyl carboxylic acids, aminocarboxylic acids and salts of the aforementioned or mixtures thereof may be employed as complexing agents. Useful carboxylic acids include the mono-, di-, tri- and tetracarboxylic acids. The carboxylic acids may be substituted with various substituent moieties such as hydroxy or amino groups and the acids may be introduced into the plating bath as their sodium, potassium or ammonium salts. Some complexing agents such as acetic acid, for example, may also act as a pH buffering agent, and the appropriate concentration of such additive components can be optimised for any plating bath in consideration of their dual functionality.

Examples of such carboxylic acids which are useful as the complexing or chelating agents in the plating bath of the present invention include: monocarboxylic acids such as acetic acid, hydroxyacetic acid (glycolic acid), aminoacetic acid (glycine), 2-amino propanoic acid (alanine); 2-hydroxy propanoic acid (lactic acid); dicarboxylic acids such as succinic acid, amino succinic acid (aspartic acid), hydroxy succinic acid (malic acid), propanedioic acid (malonic acid), tartaric acid; tricarboxylic acids such as 2-hydroxy-1,2,3 propane tricarboxylic acid (citric acid); and tetracarboxylic acids such as ethylene diamine tetra acetic acid (EDTA). In one embodiment, mixtures of two or more of the above complexing/chelating agents are utilised in the plating bath according to the present invention.

Alkyl amines can also be used as complexing agents, for example mono-, di and trialkylamines. C1-C3 alkyl amines, for example triethanolamine are preferred.

The concentration of the complexing agent or, in case more than one complexing agent is used, the concentration of all complexing agents together preferably ranges from 0.01 to 3.0 mol/l, more preferably from 0.1 to 1.0 mol/l and even more preferred from 0.2-0.6 mol/l.

In case a hypophosphite compound is used as the reducing agent, a Ni—P alloy deposit is obtained. A borane-based compound as reducing agent leads to a Ni—B alloy deposit and a mixture of hypophosphite and borane-based compounds as the reducing agents leads to a ternary Ni—B—P alloy deposit. A nitrogen-based reducing agent such as hydrazine and derivatives thereof as well as formaldehyde as reducing agent leads to nickel deposits.

Additional metal ions can be present in the nickel plating solution in case of which the respective nickel alloy is obtained as a deposit.

A suitable plating composition may be formed by dissolving the ingredients in water and adjusting the pH to the desired range.

The part to be nickel or nickel alloy plated may be plated to the desired thickness and deposit quantity by immersing the part in the nickel plating bath which is maintained over a temperature range of about 20 to 100° C., preferably 70 to 95° C. or 90° C. A deposit thickness of up to 60 μm, or higher may be employed, depending on the application.

For corrosion resistant coatings, generally a higher thickness of between 30-60 μm is desired, while for electronics applications a thickness of between 5-14 μm generally is applied.

It will be appreciated by those skilled in the art that the rate of plating may be influenced by many factors including (1) pH of the plating solution, (2) concentration of reducing agent, (3) temperature of the plating bath, (4) concentration of soluble nickel, (5) ratio of volume of bath to the surface area plated, and (6) the method and design of solution agitation, and that the above parameters are only provided to give general guidance for practicing the invention.

A high phosphorus NiP alloy is herein defined as a metallic coating containing less than 90 wt. % Ni and equal to or more than 10 wt. % P, e.g. 10.5 wt. %. Generally, high phosphorous alloys contain up to 15 wt. % P. A nickel-phosphorus (NiP) alloy containing more than about 10.5% phosphorus is known as a high phosphorous NiP coating and is paramagnetic (non-magnetic) as plated.

A mid phosphorus NiP alloy is herein defined as a metallic coating containing between 5-9 wt. % P.

The electroless plating bath of the present invention is suitable to provide nickel phosphorous alloy coatings with a wide range of P content of between 5-15 wt. % P.

Generally, the thickness of NiP deposits can vary between 5-60 μm. The thickness depends on the technical application and can be higher or lower for some applications. Fore example, if the NiP layer is deposited to provide a corrosion resistant coating, generally a thickness of between 30-60 μm is desired.

Furthermore, the plating bath composition contains a stabilising agent according to formula (1):

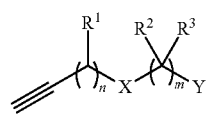
(1)

wherein X is selected from O and NR$^4$, n ranges from 1 to 6, m ranges from 1 to 8; R$^1$, R$^2$, R$^3$ and R$^4$ are independently selected from hydrogen and C$_1$ to C$_4$ alkyl; Y is selected from —SO$_3$R$^5$, —CO$_2$R$^5$ and —PO$_3$R$^5$$_2$, and R$^5$ is selected from hydrogen, C1-C4 alkyl and a suitable counter ion.

If R$^5$ is a suitable counter ion, it can for example be selected from alkali metals like sodium and potassium or nickel and ammonium. If R$^5$ is selected from the group consisting of C$_1$ to C$_4$ alkyl it is preferably methyl and ethyl.

Compounds according to formula (1) wherein n=1 or 2 are particularly preferred. Compounds according to formula (1) wherein X=O, NH or NCH$_3$ are particularly preferred. Compounds according to formula (1) wherein R$^1$, R$^2$, R$^3$ are independently selected from hydrogen and CH$_3$ are particularly preferred. Compounds according to formula (1) wherein m=1, 2, 3 or 4 are particularly preferred. Compounds according to formula (1) wherein Y is selected from —SO$_3$H, —SO$_3$Na, —SO$_3$K, —CO$_2$H, —CO$_2$Na and —CO$_2$K are particularly preferred.

For example, the following compounds can be used in a plating bath composition according to the present invention:
4-(but-3-ynyloxy)-butane-1-sulfonate-sodium salt;
3-(prop-2-ynyloxy)-propyl-1-sulfonate-sodium salt;
3-(prop-2-ynylamino)-propane-1-sulfonic acid; 2-(prop-2- ynyloxy)-acetate sodium salt; 2-(prop-2-ynyloxy)-propanoate sodium salt; 4-(prop-2-ynyloxy)-butane-1-sulfonate-sodium salt.

The concentration of the stabilising agent according to formula (1) preferably ranges from 0.02 to 5.0 mmol/l, more preferably from 0.05 to 3.0 mmol/l, even more preferred from 0.1 to 2.0 mmol/l, even more preferred from 0.1 to 5.0 mmol/l, even more preferred from 0.3 to 5.0 mmol/l, and even more preferred from 0.5 to 5.0 mmol/l.

The stabilising agents of the present invention provide a high stability to electroless nickel deposition baths against spontaneous, unwanted nickel deposition and out-plating. The stabilising agents according to the present invention are also suitable to provide high plating bath stability over a long period of time and this effect is achieved even if the bath is heated.

In addition, the stabilising agents of the present invention do not have a negative influence on the deposition rate of the electroless nickel deposition bath and the corrosion resistance of the deposited nickel or nickel alloy layer.

The stabilising agents of the present invention have the further advantage that they are less toxic than other compounds containing a carbon-carbon triple bond and known to be used in electroless nickel deposition baths, like propargyl alcohol or propargyl alcohol ethoxylate.

Other materials may be included in the plating bath according to the present invention such as pH buffers, wetting agents, accelerators, brighteners, additional stabilizing agents etc. These materials are known in the art.

The aqueous electroless plating bath may further comprises a water-soluble metal salt of an alloying metal M which is not nickel. Metal ions of the optional alloying metal M are preferably selected from the group consisting of titanium, vanadium, chromium, manganese, zirconium, niobium, molybdenum, hafnium, tantalum, tungsten, copper, silver, gold, aluminium, iron, cobalt, palladium, ruthenium, rhodium, osmium, iridium, platinum, zinc, cadmium, gallium, indium, tin, antimony, thallium, lead, and bismuth.

More preferably, the metal ions of the optional alloying metal M are selected from the group consisting of molybdenum, tungsten, copper, silver, gold, aluminium, zinc and tin.

The concentration of the metal ions of the optional alloying metal M preferably ranges from $10^{-4}$ to 0.2 mol/l, more preferably from $10^{-2}$ to 0.1 mol/l.

When adding metal ions of an alloying metal M to the aqueous electroless plating bath (depending on the kind of reducing agent present) ternary or quaternary alloys Ni-M-P, Ni-M-B, and Ni-M-B—P are deposited.

In another embodiment of the present invention, a water-soluble salt of an alloying metal M and a water-soluble salt of a second alloying metal M* are added to the aqueous electroless plating bath. In this case, nickel alloy deposits comprising alloying metals M and M* are obtained.

The aqueous electroless plating bath may further comprise particles preferably in the size range of 0.01 to 150 μm, more preferably 0.1 to 10 μm. These particles are insoluble or sparingly soluble in the plating bath.

The particles are preferably suspended in the aqueous electroless plating bath during the deposition process and are codeposited with the nickel alloy during plating. The particles codeposited may serve functionalities such as lubricity, wear and abrasion resistance, corrosion protection and combinations thereof.

The particles are selected from the group comprising ceramics such as silica and alumina, glass, talcum, plastics such as polytetrafluoroethylene (Teflon®), diamond (polycrystalline and monocrystalline types), graphite, carbon nanotubes, oxides, silicides, carbonates, carbides (such as silicon carbide and tungsten carbide), sulfides, phosphates, borides, silicates, oxylates, nitrides, fluorides of various metals, as well as metal and metal alloys of boron, tantalum, stainless steel, chromium, molybdenum, vanadium, zirconium, titanium, and tungsten.

The concentration of the optional particles in the aqueous electroless plating bath preferably ranges from 0.01 to 0.5 wt.-%.

The electroless plating bath of the present invention is particularly suitable for depositing nickel phosphorous alloys, e.g. mid and high NiP alloys as defined above. Hypophosphite based reducing agents are applied for deposition of NiP alloys. Such reducing agents provide the source of phosphorous in the deposited alloy.

High NiP alloys are particularly preferred. Such alloys are obtained when the plating process is performed at a plating rate of between 4-14 μm/hour, more preferred 6-11 μm/hour. The person skilled in the art can determine the plating parameters to obtain such plating rate by adjusting the plating parameters (temperature, concentrations etc.) with routine experiments.

High NiP alloys obtained by the electroless plating bath according to the present invention result in alloys having compressive stress. The stress values for example range between −10 to −40 N/mm². Such deposits show high corrosion resistance and good adhesion to the underlying substrate, e.g. copper substrates, they are plated on.

The electroless plating bath may further contain metal stabilizers such as Pb-, Cu-, Se-, Bi- or Sb-ions. Pb-ions are generally less desired because of their toxicity. The concentration of the metal ions can vary and e.g. range between 1-50 mg/l, preferably between 3-10 mg/l. Also, iodates can be added as additional stabilizer.

The present invention further relates to a method for electroless deposition of nickel and nickel alloys comprising the steps of
 (i) providing a substrate,
 (ii) immersing the substrate in the aqueous electroless plating bath according to the present invention,
 (iii) and thereby depositing a nickel or nickel alloy onto the substrate.

In one embodiment the method of the present invention utilizes the electroless plating bath of the present invention containing hypophosphite as the at least one reducing agent.

In a further embodiment the plating rate of the method according to the present invention varies between 4-14 μm/hour to obtain a phosphorous content of between 10 to 15 wt. %.

Substrates to be coated with a nickel or nickel alloy layer from the plating bath according to the present invention are cleaned (pre-treated) prior to metal deposition. The type of pre-treatment depends on the substrate material to be coated and is known in the art.

Copper or copper alloy surfaces are treated with an etch cleaning method which is usually carried out in oxidizing, acidic solutions, for example a solution of sulfuric acid and hydrogen peroxide. Preferably, this is combined by another cleaning in an acidic solution, such as, for example, a sulfuric acid solution which is either used prior or after etch cleaning.

For a pre-treatment of aluminum and aluminum alloys different zincations are available, for example Xenolyte® cleaner ACA, Xenolyte® Etch MA, Xenolyte® CFA or Xenolyte® CF (all available from Atotech Deutschland GmbH) which fulfil the industry standards of cyanide-free chemistry. Such pre-treatment methods for aluminum and aluminum alloys are for example disclosed in U.S. Pat. No. 7,223,299 B2.

The following non-limiting examples further illustrate the present invention.

EXAMPLES

The preparation examples relate to the synthesis of the stabilising agent employed in the plating baths of the present invention.

Preparation Example 1

Preparation of 4-(but-3-ynyloxy)-butane-1-sulfonate-sodium salt

In 85 ml THF 2.0 g (49.9 mmol) sodium hydride is suspended under Argon. To this reaction mixture 3.5 g (49.9 mmol) but-3-yn-1-ol is added drop wise at ambient temperature.

After finishing the hydrogen evolution 6.87 g (49.9 mmol) 1,2-oxathiane-2,2-dioxide dissolved in 20 ml THF is added drop wise at ambient temperature. After addition the reaction mixture was stirred for additional 12 hours and the THF removed under vacuum.

The solid residue was extracted with ethyl acetate and filtrated. The solid was dried under vacuum.

10.2 g (44.7 mmol) of a yellowish solid were obtained (89% yield).

Preparation Example 2

Preparation of 3-(prop-2-ynyloxy)-propyl-1-sulfonate-sodium salt

In 70 ml THF 1.997 g (49.9 mmol) sodium hydride is suspended under Argon. To this reaction mixture 2.830 g (49.9 mmol) prop-2-yn-1-ol is added drop wise at ambient temperature.

After finishing the hydrogen evolution 6.1 g (49.9 mmol) 1,2-oxathiolane-2,2-dioxide dissolved in 15 ml THF is added drop wise at ambient temperature. After addition the reaction mixture was stirred for additional 12 hours and the THF removed under vacuum.

The solid residue was extracted with ethyl acetate and filtrated. The solid was dried under vacuum.

9.0 g (44.9 mmol) of a yellowish solid were obtained (90% yield).

Preparation Example 3

Preparation of 3-(prop-2-ynylamino)-propane-1-sulfonic acid 4 g (71.2 mmol) prop-2-yn-1-amine were dissolved in 75 ml THF and cooled to 0° C. To this mixture 8.87 g (71.2 mmol) 1,2-oxathiolane 2,2-dioxide dissolved in 25 ml THF were added drop wise at 0° to 5° C. After addition the reaction mixture was heated to room temperature and stirred for 12 hours.

The occurring beige-colored crystals were filtrated and washed with 10 ml THF and 10 ml ethanol. The solid was dried under vacuum.

10.2 g (57.6 mmol) of a beige colored solid were obtained (81% yield).

Preparation Example 4

Preparation of 2-(prop-2-ynyloxy)-acetate sodium salt 1.8 g (44 mmol) sodium hydride were suspended in 18.88 g DMF at room temperature. To this suspension 3.5 g (37 mmol) 2-chloroacetic acid are dosed within 10 min at ambient temperature.

In a second flask 1.8 g (44 mmol) sodium hydride were suspended in 56.6 g DMF. To this suspension 2.08 g (36.74 mmol) prop-2-yn-1-ol are given at room temperature.

After finishing the hydrogen evolution the solution of the sodium salt of the 2-chloroacetic acid is added drop wise to the solution of the sodium prop-2-yn-1-olate at room temperature within 6 minutes. After addition the reaction mixture was stirred for additional 25 hours at room temperature and heated to 50° C. for additional 10 hours.

The reaction mixture was cooled to room temperature and hydrolyzed with 20 ml water. The solvent was removed and the residue solved in 50 ml methanol and filtrated. The filtrate was evaporated and the solid residue washed with 200 ml diethylether.

The resulting solid was dried under vacuum.

4.9 g (36 mmol) of a brownish solid were obtained (98% yield).

Preparation Example 5

Preparation of 2-(prop-2-ynyloxy)-propanoate sodium salt 1.6 g (39.11 mmol) sodium hydride were suspended in 18.88 g DMF at room temperature. To this suspension 3.8 g (33 mmol) 2-chloropropanoic acid are dosed within 10 min at ambient temperature.

In a second flask 1.6 g (39.11 mmol) sodium hydride were suspended in 56.64 g DMF. To this suspension 1.886 g (363.33 mmol) prop-2-yn-1-ol are given at room temperature.

After finishing the hydrogen evolution the solution of the sodium salt of the 2-chloropropanoic acid is added drop wise to the solution of the sodium prop-2-yn-1-olate at room temperature within 6 minutes. After addition the reaction mixture was stirred for additional 25 hours at room temperature and heated to 50° C. for additional 10 hours.

The reaction mixture was cooled to room temperature and hydrolyzed with 20 ml water. The solvent was removed and the residue solved in 50 ml methanol and filtrated. The filtrate was evaporated and the solid residue washed with 200 ml diethylether.

The resulting solid was dried under vacuum.

4.79 g (32 mmol) of a brownish solid were obtained (96% yield).

Example 6

Propargyl alcohol ethoxylate is commercially available, e.g. from BASF AG (Golpanol PME).

Preparation Example 7

Preparation of 4-(prop-2-ynyloxy)-butane-1-sulfonate-sodium salt

In 45 mL THF 1.999 g (50 mmol) sodium hydride is suspended under Argon. To this reaction mixture 2.830 g (50 mmol) prop-2-yn-1-ol is added drop wise at ambient temperature.

After finishing the hydrogen evolution 6.87 g (50 mmol) 1,2-oxathiane-2,2-dioxide dissolved in 20 mL THF is added drop wise at ambient temperature. After addition the reaction mixture was stirred for additional 12 hours and the THF removed under vacuum.

The solid residue was extracted with ethyl acetate and filtrated. The solid was dried under vacuum.

8.4 g (39.2 mmol) of a yellowish solid were obtained (78% yield).

Example 8

Determination of the Stability Number of Electroless Plating Baths

Respective stabilising agents in Examples 1 to 5 (according to the present invention) as well as 6 (comparative) were added to an aqueous plating bath stock solution comprising

| | | |
|---|---|---|
| NiSO$_4$•6H$_2$O | 26.3 g/l | 0.1 mol/l |
| Lactic acid (90 wt. %) | 24.0 g/l | 0.27 mol/l |
| Malic acid | 19.8 g/l | 0.15 mol/l |
| Sodium hypophosphite monohydrate | 30 g/l | 0.22 mol/l |

100 ml of the plating bath under consideration were heated to 80±1° C. in a 200 ml glass beaker while stirring. Next, 0.2 ml of a palladium test solution (125 mg/l palladium chloride in deionized water) was added every 60 s to the plating bath. The test is finished when a gray precipitate associated with gas bubbles is formed in the plating bath which indicates the undesired decomposition of the plating bath.

The stability number achieved for the plating bath under consideration corresponds to the number of palladium test solutions added in increments of 0.2 ml within a one minute interval to the plating bath until formation of a gray precipitate. The values given correspond to a freshly prepared plating bath right after heating to the temperature of 80° C., after 120 minutes and after 240 minutes at 80° C.

The entry 17 for Sample 1 (Table 1 in column Stability Nos./time "0") for example corresponds to an addition of 17 times 0.2 ml of a palladium chloride solution to a plating bath which was heated to 80° C. After 3.4 ml (17 times 0.2 ml/l added in one minute intervals) and 17 minutes, a gray precipitate occurs. The stability numbers for the entries in Table 1 "120 min" (heating for 120 minutes at 80° C.) and "240 min" (heating for 240 minutes at 80° C.) result in stability numbers of 16 and 15, respectively, indicating that the bath retains its high stability even after prolonged heating.

TABLE 1

Stability numbers for various bath compositions

| | | Stability Nos./time | | |
|---|---|---|---|---|
| Sample No. | stabilising agent | 0 min | 120 min | 240 min |
| 1 | 4-(but-3-ynyloxy)-butane-1-sulfonate-sodium salt 150 mg/l | 17 | 16 | 15 |
| 2 | 3-(prop-2-ynyloxy)-propyl-1-sulfonate-sodium salt 100 mg/l | 11 | 11 | 11 |
| 3 | 3-(prop-2-ynylamino)-propane-1-sulfonic acid 300 mg/l | 20 | 20 | 19 |
| 4 | 2-(prop-2-ynyloxy)-acetate sodium salt 200 mg/l | 16 | 14 | 12 |
| 5 | 2-(prop-2-ynyloxy)-propanoate sodium salt 200 mg/l | 10 | 7 | 3 |
| 6 (comp.) | propargyl alcohol ethoxylate 200 mg/l | 6 | 2 | 1 |

Figure 2:
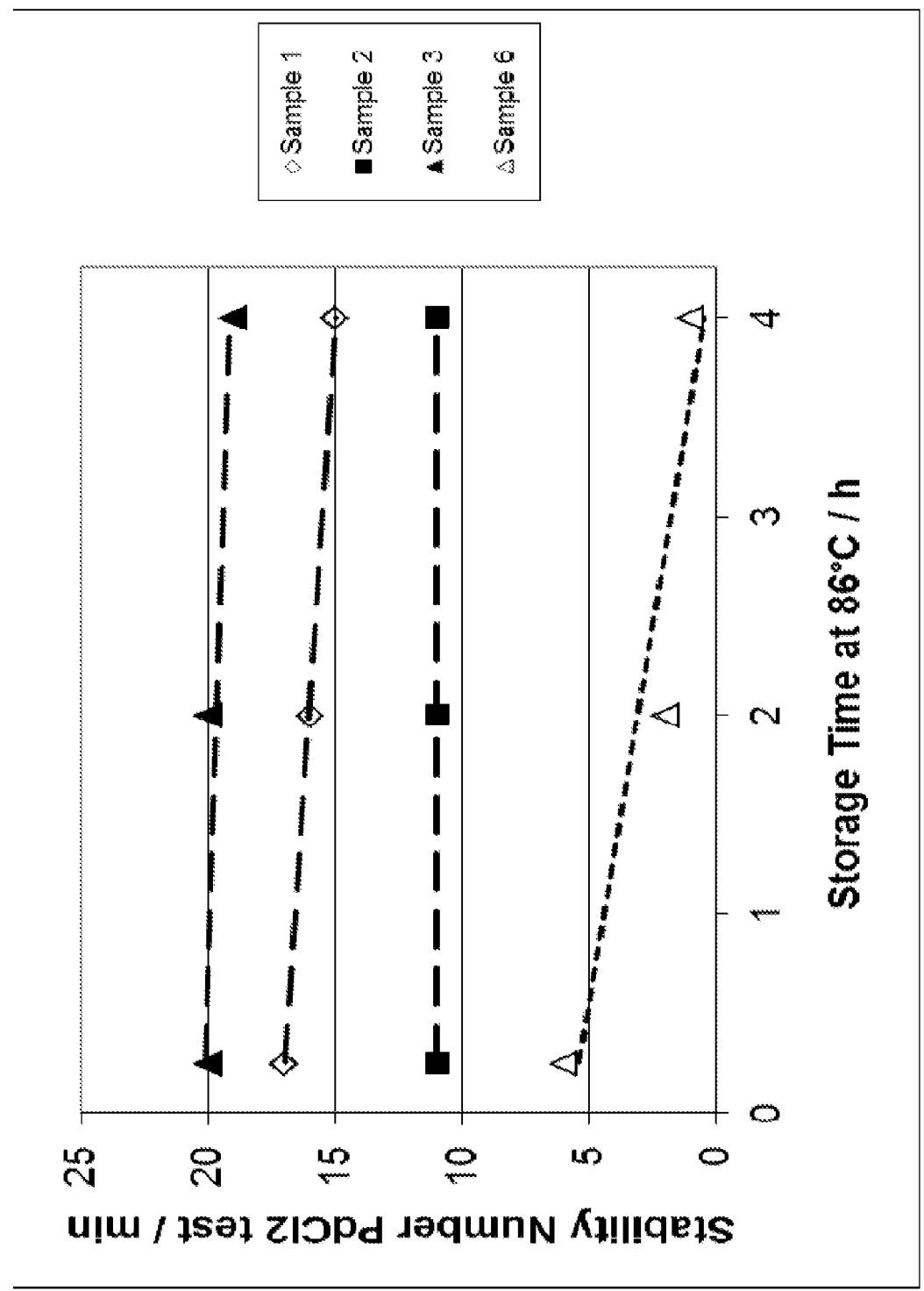
FIG. 2 shows the stability of electroless nickel deposition baths containing an inventive stabilising agent (samples 1 to 3) or a comparative compound (sample 6) during storage time, also called idle time.

As becomes apparent from Table 1 and FIG. 2 stabilising agents according to the present invention are suitable to provide high plating bath stability over a long period of time. In contrast, propargyl alcohol ethoxylate, a comparative compound with structural similarity to the stabilising agents of the invention, namely a carbon-carbon triple bond, has a lower stabilising effect on the electroless nickel deposition bath and does not act as a stabilising agent for a long time period.

Example 9

Table 2 shows that the stabilising agent does not negatively influence the plating rate.

The plating experiments according to Table 2 were carried out in a one liter beaker using one liter of solution NiSO$_4$.6H$_2$O (26.3 g/l) and triethanolamine as a complexing agent, sodium hypophosphite monohydrate (30 g/l) and different concentrations of the additive at a temperature of 86° C. (water bath) and a pH of 4.8.

Deposition rate was measured using a stainless steel strip with a thickness of 0.1 mm which was plated for one hour. Measurement was with a micrometer device. Determination of plating rate=0.5×(panel thickness after plating–panel thickness before plating in μm).

Stress in the coating was measured using a stress strip finger. The test strips are made from chemically etched beryllium-copper alloy and have spring like properties. After plating the test strip is mounted on the Testing Stand (Deposit stress analyzer Model No. 683 of Specialty Testing & Development Co., York, Pa., USA) which measures the distance that the test strip legs have spread after plating. The distance U is included in a formula which calculates the deposit stress.

Stress=$U/3*T*K$

U is the number of increments spread, T is the deposit thickness and K is the strip calibration constant.

The deposit thickness T is determined by the weight-gain method and determined according to the following formula: T=W/D*A, wherein W=deposit weight in grams, D=specific gravity of the deposited metal in grams per cm$^3$, and A=surface area in cm$^2$.

It is recognized that each lot of test strips manufactured will respond with slight differences when used for deposit stress test. This degree of difference will be determined by the supplier when each lot of test strips is calibrated. The value for K will be supplied with each lot of test strips provided by Specialty Testing & Development Co.

Stress is also determined to be of compressive or tensile nature. If the test strip legs are spread outward on the side that has been plated, the deposit stress is tensile in nature. If the test strip legs are spread inward on the side that has been plated, the deposit stress is compressive in nature.

TABLE 2

Deposition rate and stress in the coating by different concentrations of the additive 3-(prop-2-ynyloxy)-propyl-1-sulfonate-sodium salt (Example 2)

| Additive [mg/l] | Dep. Rate [μm/h] | Stress [N/mm$^2$] |
|---|---|---|
| 20 | 6 | −25.16 |
| 40 | 6 | -23.48 |
| 60 | 7 | -18.69 |
| 80 | 6 | -20.13 |
| 100 | 6 | -23.48 |
| 150 | 6 | -23.64 |

Table 2 also shows that the deposits obtained by plating from bath compositions according to the present invention exhibit a compressive stress which is desired since it positively influences the corrosion protection of the deposited nickel layer.

Example 10

Further experiments were performed to test the nickel plating bath according to the present invention for producing small structures as used in the semiconductor industry.

An aqueous plating bath containing

| | | |
|---|---|---|
| NiSO$_4$•6H$_2$O | 26.3 g/l | 0.1 mol/l |
| Lactic acid (90 wt. %) | 24.0 g/l | 0.27 mol/l |
| Malic acid | 19.8 g/l | 0.15 mol/l |
| Sodium hypophosphite monohydrate | 30 g/l | 0.22 mol/l |

Four different plating bath compositions were prepared by adding the following stabilising agents to the above mentioned bath matrix.

| | |
|---|---|
| 3-(prop-2-ynylamino)-propane-1-sulfonic acid (Example 3) | 35 mg/l |
| 4-(prop-2-ynyloxy)-butane-1-sulfonate-sodium salt (Example 7) | 100 mg/l |
| 4-(but-3-ynyloxy)-butane-1-sulfonate-sodium salt (Example 1) | 150 mg/l |
| 3-(prop-2-ynyloxy)-propyl-1-sulfonate-sodium salt (Example 2) | 120 mg/l. |

A Comparative Example was performed using the above mentioned bath matrix without an additive.

Deposition of nickel was on the copper pads of a test substrate as shown in FIG. 1. Such substrates are used for plating experiments in the semiconductor industry. FIG. 1 shows a number of 16 metallised copper pads. The numbers denote:

50 (diameter of the copper pads in μm), 75 (pitch (distance between the center of two copper pads) in μm).

The plating was performed by immersing the substrate into the plating composition described above (pH=4.9, T=85° C.).

Very good plating results can be obtained applying plating bath compositions containing stabilising agents according to the present invention: no overplating and very homogenous thickness distribution of the deposited nickel phosphorous alloy is observed.

With regards to the Comparative Example: Pads metalized from the stabilizer-free nickel bath show inhomogeneous (with regards to the thickness distribution over the surface) nickel deposits and small dots at the edges of the pads.

Example 11

According to Invention

Determination of the Stability Number of Electroless Plating Baths for Different Concentrations of Stabilising Agents:

Respective stabilising agents in Examples 1 to 5 and 7 (according to the present invention) were added in different amounts to the aqueous plating bath stock solution of Example 8 and kept at a temperature of 23° C. Shortly after reaching a constant temperature the stability numbers were determined as described in Example 8. Concentrations of the stabilising agents and corresponding stability numbers are summarized in Table 3.

TABLE 3

Stability numbers for various concentrations of stabilising agents

| Sample No. | Stabilising agent | Concentration in mg/l | Stability No. |
|---|---|---|---|
| 1 | 4-(but-3-ynyloxy)-butane-1-sulfonate-sodium salt | 400 | 12 |
| | | 600 | 25 |
| 2 | 3-(prop-2-ynyloxy)-propyl-1-sulfonate-sodium salt | 400 | 11 |
| | | 600 | 23 |
| | | 800 | 25 |
| 3 | 3-(prop-2-ynylamino)-propane-1-sulfonic acid | 200 | 10 |
| | | 300 | 20 |
| 4 | 2-(prop-2-ynyloxy)-acetate sodium salt | 100 | 12 |
| | | 150 | 15 |
| | | 200 | 17 |
| 5 | 2-(prop-2-ynyloxy)-propanoate sodium salt | 200 | 10 |
| | | 400 | 17 |
| 7 | 4-(prop-2-ynyloxy)-butane-1-sulfonate-sodium salt | 300 | 13 |
| | | 400 | 15 |
| | | 500 | 19 |
| | | 600 | 21 |

As becomes apparent from Table 3 stabilising agents according to the present invention are suitable to provide high plating bath stability over a broad concentration range.

Example 12

According to Invention

Determination of the Stability Number of Electroless Plating Baths During Prolonged Time:

Respective stabilising agents in Examples 2, 3 and 7 (according to the present invention) were added to the aqueous plating bath stock solution of Example 8 and heated to 86° C. for the duration of the experiment. At certain times samples of 100 ml of the plating bath under consideration were transferred to a 200 ml glass beaker and heated to 80±1° C. while stirring. The stability numbers were determined as described in Example 8. Concentrations of the stabilising agents, times and corresponding stability numbers are summarized in Table 4.

TABLE 4

Stability numbers for various bath compositions during prolonged time

| Sample No. concentration | Stability Nos./time in hours | | | | | | | |
|---|---|---|---|---|---|---|---|---|
| | 1 | 2 | 3 | 4 | 5 | 6 | 7 | 8 |
| 2 300 mg/l | 11 | 11 | 11 | 12 | 12 | 12 | 12 | 12 |
| 3 300 mg/l | 20 | 21 | 21 | 21 | 23 | 22 | 22 | 23 |
| 7 600 mg/l | 20 | 20 | 20 | 21 | 20 | 21 | 21 | 21 |

As becomes apparent from Table 4 stabilising agents according to the present invention are suitable to provide high plating bath stability over a long period of time even if the bath is heated.

Example 13

Comparative Example

Determination of the Stability Number of Electroless Plating Baths for Different Concentrations of Stabilising Agents The stabilising agent in Example 2 (according to the present invention) as well as comparative compounds propargyl sulfonic acid sodium salt (sample 8), 3-hexyne-2,5-diol (sample 9) and 2-butyne-1-ol (sample 10) were added in different amounts to the aqueous plating bath stock solution of Example 8 and kept at a temperature of 23° C. Shortly after reaching a constant temperature the stability numbers were determined as described in Example 8. Concentrations of the stabilising agent, the comparative compounds and corresponding stability numbers are summarized in Table 5. Propargyl sulfonic acid sodium salt is commercially available, e.g. from BASF AG (Golpanol PS). 3-Hexyne-2,5-diol and 2-butyne-1-ol are also commercially available.

TABLE 5

Stability numbers for various concentrations of stabilising agents and comparative compounds

| Sample No. | Stabilising agent | Concentration in mmol/l | Stability No. |
|---|---|---|---|
| 2 | 3-(prop-2-ynyloxy)-propyl-1-sulfonate-sodium salt | 0.5 | 10 |
| | | 1.25 | 18 |
| 8 (comp.) | propargyl sulfonic acid sodium salt | 0.5 | 8 |
| | | 1.25 | 8 |
| 9 (comp.) | 3-hexyne-2,5-diol | 0.5 | 7 |
| | | 1.25 | 13 |
| 10 (comp.) | 2-butyne-1-ol | 0.5 | 6 |
| | | 1.25 | 12 |

As becomes apparent from Table 5 stabilising agents according to the present invention are suitable to provide high plating bath stability over a broad concentration range. In contrast, comparative compounds with structural similarity to the stabilising agents of the invention, namely a carbon-carbon triple bond, exhibit a significantly lower stabilising effect when added with the same concentration to an electroless nickel deposition bath.

The invention claimed is:

1. An aqueous plating bath composition for electroless deposition of nickel and nickel alloys, the plating bath comprising
    (i) a source of nickel ions,
    (ii) at least one complexing agent,
    (iii) at least one reducing agent, and
    (iv) a stabilising agent according to formula (1):

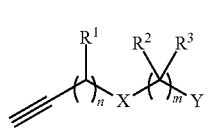

(1)

wherein X is selected from the group consisting of O and $NR^4$, n ranges from 1 to 6, m ranges from 1 to 8; $R^1$, $R^2$, $R^3$ and $R^4$ are independently selected from the group consisting of hydrogen and $C_1$ to $C_4$ alkyl; Y is selected from the group consisting of $-SO_3R^5$, $-CO_2R^5$ and $-PO_3R^5{}_2$, and $R^5$ is selected from the group consisting of hydrogen, C1-C4 alkyl and a suitable counter ion wherein the concentration of the stabilizing agent according to formula (1) ranges from 0.02 to 5.0 mmol/l.

2. The aqueous electroless plating bath according to claim 1 wherein $R^1$, $R^2$, $R^3$ and $R^4$ are selected from the group consisting of hydrogen, methyl and ethyl.

3. The aqueous electroless plating bath according to claim 1 wherein $R^5$ is selected from the group consisting of hydrogen, methyl, ethyl, sodium, potassium, nickel and ammonium.

4. The aqueous electroless plating bath according to claim 1 wherein Y is $SO_3R^5$.

5. The aqueous electroless plating bath according to claim 1 further comprising at least one source of the alloying metal ion and wherein the at least one alloying metal ion is selected from the group consisting of titanium, vanadium, chromium, manganese, zirconium, niobium, molybdenum, hafnium, tantalum, tungsten, copper, silver, gold, aluminium, iron, cobalt, palladium, ruthenium, rhodium, osmium, iridium, platinum, zinc, cadmium, gallium, indium, tin, antimony, thallium, lead, and bismuth.

6. The aqueous electroless plating bath according to claim 1 wherein the plating bath has a pH value of 3.5 to 7.

7. The aqueous electroless plating bath according to claim 1 wherein the concentration of nickel ions ranges from 0.1 to 60 g/l.

8. The aqueous electroless plating bath according to claim 1 wherein the at least one complexing agent is selected from the group consisting of amines, carboxylic acids, hydroxyl carboxylic acids, aminocarboxylic acids and salts of the aforementioned.

9. The aqueous electroless plating bath according to claim 1 wherein the concentration of the at least one complexing agent ranges from 0.01 to 3.0 mol/l.

10. The aqueous electroless plating bath according to claim 1 wherein the concentration of the at least one reducing agent ranges from 0.01 to 3.0 mol/I.

11. The aqueous electroless plating bath according to claim 1 wherein the at least one reducing agent is a hypophosphite salt.

12. A method for electroless deposition of nickel and nickel alloys comprising the steps of
    (i) providing a substrate,
    (ii) immersing the substrate in the aqueous electroless plating bath according to claim 1,
    (iii) and thereby depositing a nickel or nickel alloy onto the substrate.

13. Method according to claim 12 wherein the electroless plating bath contains hypophosphite as the at least one reducing agent.

14. Method according to claim 12 wherein the plating rate varies between 4-14 μm/hour to obtain a phosphorous content of between 10 to 15 wt. %.

15. Method according to claim 13 wherein the plating rate varies between 4-14 µm/hour to obtain a phosphorous content of between 10 to 15 wt. %.

16. The aqueous electroless plating bath according to claim 2 wherein $R^5$ is selected from the group consisting of hydrogen, methyl, ethyl, sodium, potassium, nickel and ammonium.

17. The aqueous electroless plating bath according to claim 2 wherein Y is $SO_3R^5$.

18. The aqueous electroless plating bath according to claim 3 wherein Y is $SO_3R^5$.

19. The aqueous electroless plating bath according to claim 1 wherein $R^1$, $R^2$, $R^3$ and $R^4$ are selected from the group consisting of hydrogen, methyl and ethyl, $R^5$ is selected from the group consisting of hydrogen, methyl, ethyl, sodium, potassium, nickel and ammonium, and Y is $SO_3R^5$.

* * * * *